US006855615B2

(12) United States Patent
Komori

(10) Patent No.: US 6,855,615 B2
(45) Date of Patent: Feb. 15, 2005

(54) METHOD OF MANUFACTURING SEMICONDUCTOR DEVICE HAVING AN IMPROVED ISOLATION STRUCTURE

(75) Inventor: Shigeki Komori, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/214,603

(22) Filed: Aug. 9, 2002

(65) Prior Publication Data

US 2002/0190345 A1 Dec. 19, 2002

Related U.S. Application Data

(62) Division of application No. 09/514,944, filed on Feb. 28, 2000, now Pat. No. 6,452,246.

(30) Foreign Application Priority Data

Jul. 16, 1999 (JP) ............................................ 11-203849

(51) Int. Cl.⁷ ............................................ H01L 21/762
(52) U.S. Cl. ........................................ 438/424; 438/437
(58) Field of Search ........................... 438/424, 437, 438/FOR 227, E21.549, E21.55

(56) References Cited

U.S. PATENT DOCUMENTS

| | | | | |
|---|---|---|---|---|
| 5,780,346 A | * | 7/1998 | Arghavani et al. | 438/296 |
| 5,858,866 A | | 1/1999 | Berry et al. | |
| 5,863,827 A | | 1/1999 | Joyner | |
| 5,880,004 A | * | 3/1999 | Ho | 438/421 |
| 5,904,538 A | | 5/1999 | Son et al. | |
| 5,933,748 A | * | 8/1999 | Chou et al. | 438/431 |
| 5,966,614 A | * | 10/1999 | Park et al. | 438/401 |
| 6,002,160 A | | 12/1999 | He et al. | 257/513 |
| 6,034,393 A | | 3/2000 | Sakamoto et al. | 257/315 |
| 6,034,409 A | | 3/2000 | Sakai et al. | 257/506 |
| 6,090,684 A | * | 7/2000 | Ishitsuka et al. | 438/424 |
| 6,175,140 B1 | * | 1/2001 | Kajiyama | 257/401 |
| 6,228,727 B1 | * | 5/2001 | Lim et al. | 438/296 |
| 6,265,743 B1 | * | 7/2001 | Sakai et al. | 257/305 |
| 6,326,282 B1 | * | 12/2001 | Park et al. | 438/424 |
| 6,566,224 B1 | * | 5/2003 | Chang et al. | 438/424 |
| 2003/0032260 A1 | * | 2/2003 | Ahn et al. | 438/443 |

FOREIGN PATENT DOCUMENTS

| | | |
|---|---|---|
| EP | 0928023 A1 | 7/1999 |
| JP | 57149750 A | 9/1982 |
| JP | 2-113548 | 4/1990 |
| JP | 4-67648 | 3/1992 |
| JP | 10-64994 | 3/1998 |
| JP | 10-223747 | 8/1998 |
| KR | 1996-0039277 | 11/1996 |
| KR | 1998-0012599 | 4/1998 |
| WO | WO97/06558 | 2/1997 |

* cited by examiner

*Primary Examiner*—George Fourson
(74) *Attorney, Agent, or Firm*—McDermott Will & Emery LLP

(57) ABSTRACT

A trench is formed on a primary surface of a semiconductor substrate, and is filled with trench material to separate the surface region of the semiconductor substrate into plural active regions. At least a portion of the surface of the trench material adjoining the semiconductor substrate is depressed by a predetermined depth with reference to the primary surface of the semiconductor device. Thus, prevented is a decrease in a drain current of a semiconductor device having a trench isolation structure.

1 Claim, 15 Drawing Sheets

BACKGROUND

BACKGROUND

BACKGROUND

METHOD OF MANUFACTURING SEMICONDUCTOR DEVICE HAVING AN IMPROVED ISOLATION STRUCTURE

RELATED APPLICATION

This application is a divisional of U.S. patent application Ser. No. 09/514,944, filed Feb. 28, 2000 now U.S. Pat. No. 6,452,246.

BACKGROUND OF THE INVENTION

1. Field of the Invention

The present invention relates to an improvement of a semiconductor device having a trench isolation structure.

2. Background Art

In accordance with miniaturization of a semiconductor element, isolation between elements has also come to be effected on a much more minute scale. A method of defining an isolation region by thermal oxidation of a silicon substrate, what is called Local Oxidation of Silicon (LOCOS), inevitably involves generation of a structural defect called a bird's beak. Thus, the LOCOS method involves a problem of the bird's beak destroying a minute active region sandwiched between the isolation regions. A widely-known approach to solve this problem is to prevent formation of a bird's beak by means of the trench isolation method.

The trench isolation method involves embedding an insulating layer in a trench formed in a silicon substrate. After the insulating layer is embedded in the trench, the film is etched to the vicinity of the primary surface of the silicon substrate. The etched surface is smoothed by means of a widely-used dry etching or chemical-and-mechanical polishing (CMP) method.

As shown in FIG. 23, an active region 11 and an isolation region 21a coexist in a semiconductor substrate 10 of an actual semiconductor device, and an embedded oxide film constituting the isolation region 21a is formed so as to become raised in comparison to the primary surface of the active region 11. Reference numeral 21b designates a bird's beak. In this structure, as in the case of a LOCOS structure, formation of a parasitic MOS can be prevented by raising an isolation oxide film higher than the silicon substrate 10. Further, there can be prevented a reduction in a withstand voltage with respect to a gate, which would otherwise be caused when the edge of an opening of the trench isolation structure becomes steeps.

However, such a conventional semiconductor device suffers the following problems.

FIG. 24 is a cross-sectional view showing the conventional semiconductor device as viewed from the widthwise direction of the gate. As indicated by arrows in the drawing, the effective width of the gate becomes smaller, which in turn diminishes the amount of drain current.

FIG. 25 shows another conventional semiconductor device as viewed from the widthwise direction of the gate. In such an example of the conventional semiconductor device, an n-type layer 16 is formed on, e.g., a p-type layer 15 of the semiconductor substrate 10. In this case, a silicide layer 80 is formed close to the bird's beak 21b, and a junction edge of the n-type layer 16 (which is a reverse conductive layer) beneath the silicide layer 80 comes close to the silicide layer 80. Therefore, a depletion layer is susceptible to becoming closer to the silicide, thereby resulting in a decrease in the withstand voltage of the device.

The conventional trench isolation structure as described above is likely to exhibit a so-called narrow channel effect. Specifically, the threshold voltage of the transistor is likely to increase in association with miniaturization of the semiconductor device and is prone to becoming difficult to control, which in turn results in lack of drain current or makes the semiconductor device inoperable.

SUMMARY OF THE INVENTION

The present invention has been conceived to solve the problems as associated with the conventional semiconductor device, and the object of the present invention is to provide an improved semiconductor device, and a method of manufacturing such a semiconductor device, which prevents a decrease in the amount of drain current in a transistor.

According to one aspect of the present invention, a semiconductor device comprises a semiconductor substrate having a primary surface, and a trench isolation region formed in the primary surface of the semiconductor substrate for separating the surface region of the semiconductor substrate into a plurality of active regions. At least a portion of the trench isolation region adjoining the semiconductor substrate is depressed by a predetermined depth with respect to the primary surface of the semiconductor device.

According to another aspect of the present invention, in a method of manufacturing a semiconductor device, a-trench for a trench isolation structure is formed on a primary surface of a semiconductor substrate through a mask pattern formed on the primary surface of the semiconductor substrate. An insulating layer is formed on the primary surface of the semiconductor substrate so as to fill the trench. The insulating layer is removed substantially to the height of the primary surface of the semiconductor substrate. The mask pattern is removed. The insulating layer is removed by a predetermined depth, to thereby cause the insulating layer provided within the trench to recede from the primary surface of the semiconductor substrate by a predetermined depth thereby forming a trench isolation structure.

In another aspect of the present invention, in a method of manufacturing a semiconductor device, an insulating layer is removed at a portion adjoining the semiconductor substrate to recede from the primary surface of the semiconductor substrate by a predetermined depth thereby forming a trench isolation structure.

Other and further objects, features and advantages of the invention will appear more fully from the following description.

DETAILED DESCRIPTION OF THE PREFERRED EMBODIMENTS

Figure 1:
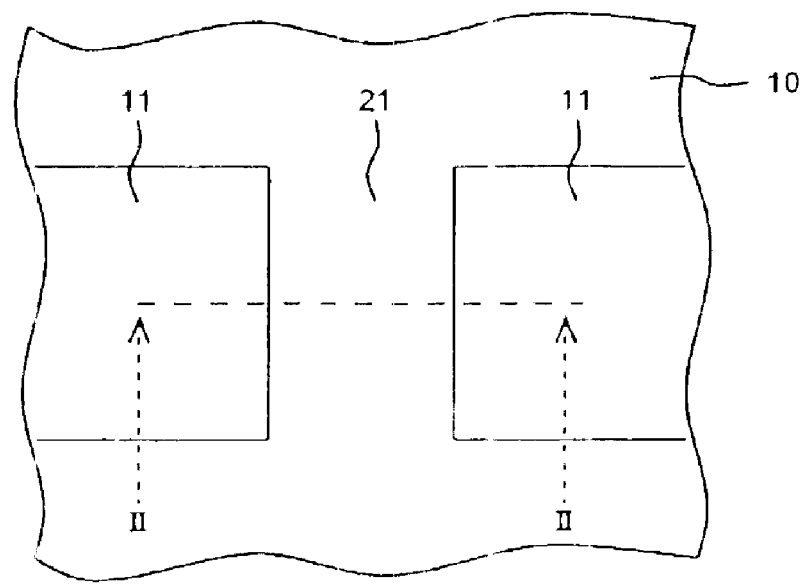
FIG. 1 is a partial plan view showing a semiconductor device according to a first embodiment of the present invention.

Preferred embodiments of the present invention will be described hereinbelow. Throughout the drawings, like reference numerals designate like or corresponding elements, and repeated explanations will be simplified or omitted.

First Embodiment

Figure 2:
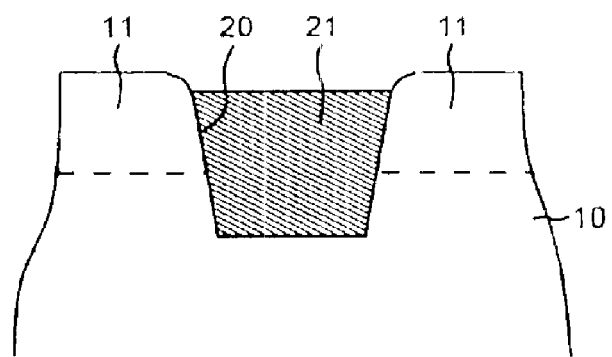
FIG. 2 is a partial cross-sectional view taken along the line II—II provided in FIG. 1.

FIGS. 1 and 2 are fragmentary views showing a semiconductor device according to a first embodiment of the present invention. FIG. 1 is a plan view, and FIG. 2 is a cross-sectional view taken along line II—II provided in FIG. 1.

In FIGS. 1 and 2, reference numeral 10 designates a semiconductor substrate such as silicon semiconductor substrate. Reference numeral 11 designates an active region; 20 designates a trench; and 21 designates a trench material, such as a silicon oxide layer as an insulating layer, embedded in the trench 20 in order to constitute a trench isolation region. As shown in FIG. 2, the present embodiment is characterized in that the entire surface of the trench material 21 is lower than the primary surface of the semiconductor substrate 10 by a given amount. The depth of such a depression is about 2 to 5 nm. The depression is set so as to remain even after oxidation of the gate.

As shown in FIG. 2, the trench 20 has a broader cross section at its upper end and a narrower cross section at its lower end.

An obtuse angle is formed between the primary surface of the semiconductor substrate 10 and the side surface of the trench material 21, and the edge of the primary surface adjoining the trench material 21 assumes a curved profile. In short, the edge of the semiconductor substrate 10 along the opening of the trench 20 is rounded.

Figure 3:
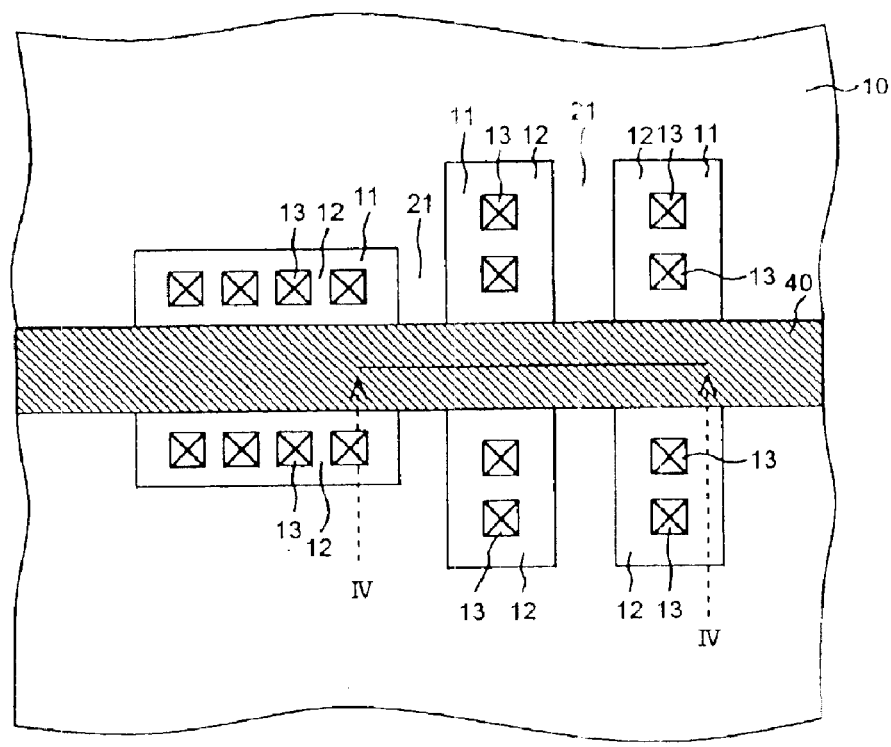
FIG. 3 is a partial plan view of a MOSFET in a semiconductor device according to the first embodiment.
Figure 4:
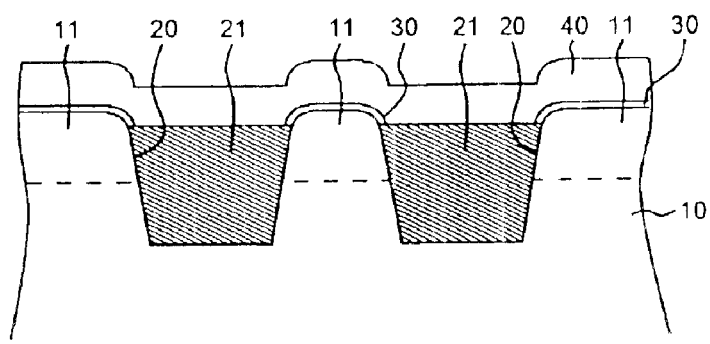
FIG. 4 is a partial cross-sectional view taken along the line IV—IV provided in FIG. 3.

FIGS. 3 and 4 show a structure of a MOSFET according to the first embodiment. FIG. 3 is a plan view of the MOSFET, and FIG. 4 is a cross-sectional view taken along line IV—IV provided in FIG. 3.

In FIGS. 3 and 4, reference numeral 12 designates a source or drain region; 13 designates a source or drain contact; 30 designates a gate insulation film (oxide film); and 40 designates a gate electrode.

When the present invention is applied to a MOSFET, as shown in FIGS. 3 and 4, the drive capability of the MOFET can be improved.

The gate electrode 40 is not limited to a single layer such as that shown in the drawings, and may assume a multilayer structure such as polycide.

Figure 5:
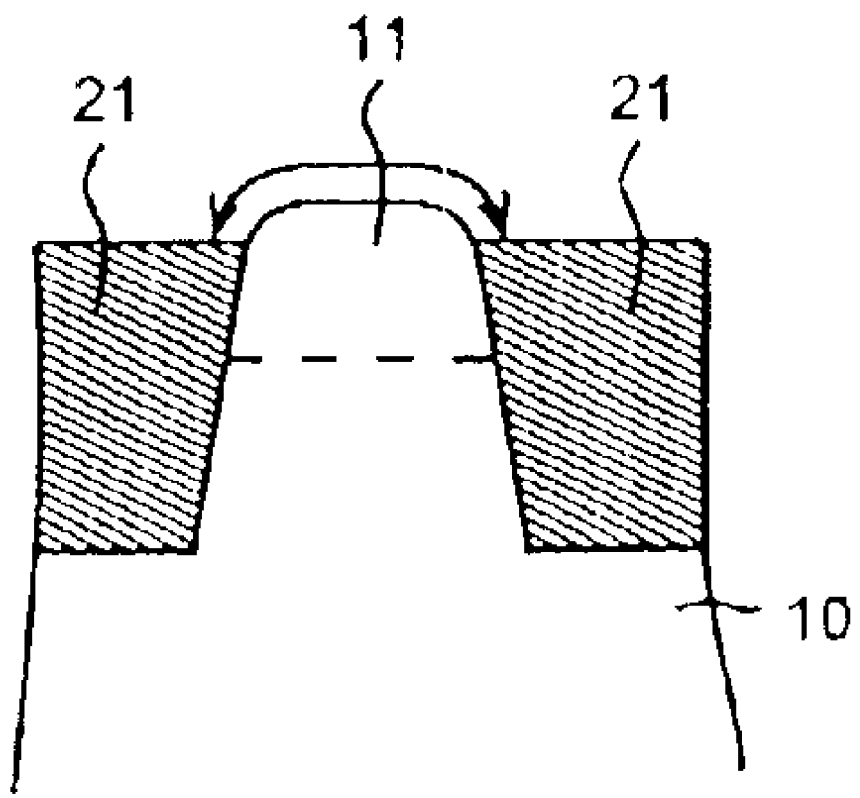
FIG. 5 is a partial cross-sectional view showing a semiconductor device according to the first embodiment as viewed from the widthwise direction of the gate.

FIG. 5 is a cross-sectional view showing the semiconductor device according to the first embodiment as viewed from the widthwise direction of the gate.

Figure 24:
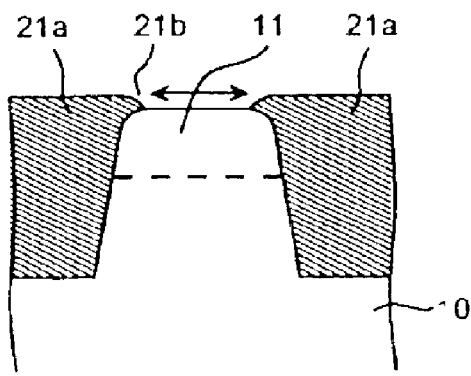
FIG. 24 is a partial cross-sectional view of a MOSFET in a conventional semiconductor device as viewed from the widthwise direction of the gate.
Figure 25:
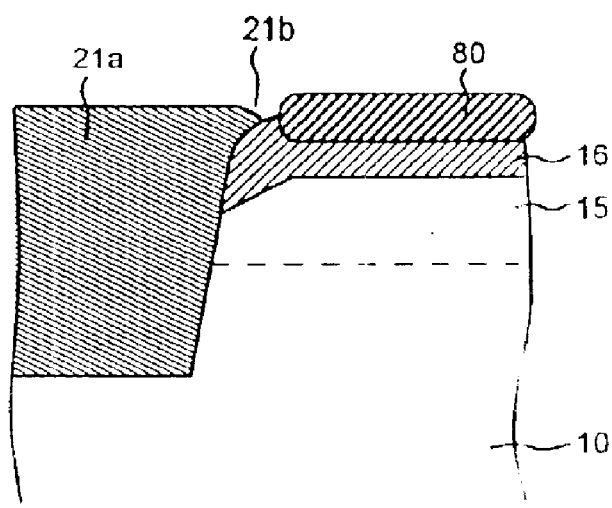
FIG. 25 is an enlarged partial cross sectional view of a MOSFET in a conventional semiconductor device as viewed from the widthwise direction of the gate.

As indicated by an arrow provided in the drawing, the effective gate width becomes greater than that of the conventional semiconductor device as shown in FIG. 24, and the amount of drain current is increased accordingly. Further, there is prevented a rise in the threshold volatge, which would otherwise be caused by a back bias, thereby implementing a MOSFET whose characteristics have little dependence on the source resistance.

FIGS. 6A to 6E are fragmentary cross-sectional views for describing one example of a method of manufacturing a semiconductor device according to the first embodiment.

Figure 6A:
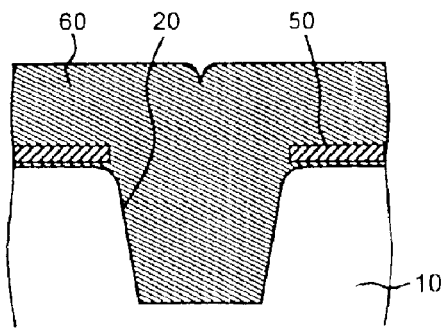
FIGS. 6A to 6E are partial cross-sectional views for describing an example of a method of manufacturing a semiconductor device according to the first embodiment.

As shown in FIG. 6A, a mask is formed of, e.g., a nitride film 50 (or an oxide film), on the surface of the semiconductor substrate 10. The trench 20 is formed in the semiconductor substrate 10 by means of etching by use of the mask pattern 50. The interior wall of the trench 20 is oxidized, and the trench 20 is filled with a trench material 60 (i.e. an silicon oxide layer as an insulating layer) by means of deposition.

Figure 6B:
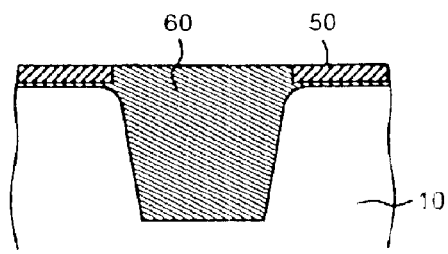
Figure 6C:
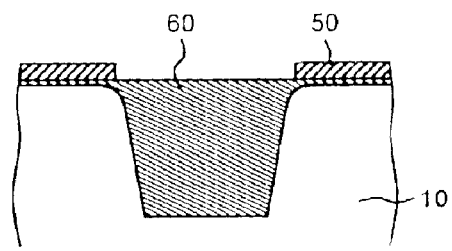
Figure 6D:
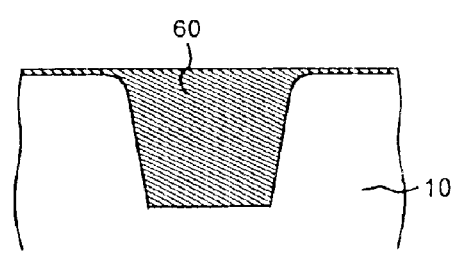
Figure 6E:
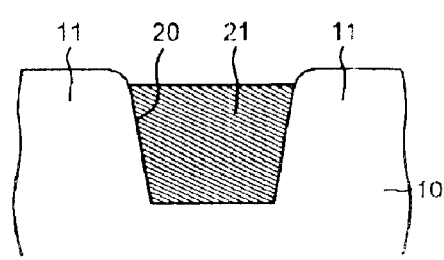

An excessive portion of the trench material 60 in the state shown in FIG. 6A is removed by means of dry etching or CMP, thus processing the semiconductor substrate 10, as shown in FIG. 6B. A portion of the upper layer of the trench material 60 shown in FIG. 6B is removed by use of hydrofluoric acid, whereby the trench material 60 assumes a profile such as that shown in FIG. 6C. The nitride film 50 shown in FIG. 6C is removed by means of hot phosphoric acid so as to bring the semiconductor device into a state shown in FIG. 6D. Finally, the upper layer of the trench material 60 shown in FIG. 6D is further removed to a predetermined depth by means of hydrofluoric acid, so that, as shown in FIG. 6E, the resultant silicon substrate 10 and the trench material 21 assume the same geometry as that shown in FIG. 1 associated with the first embodiment. The predetermined depth of the depression of the trench material 21 with respect to the surface of the semiconductor substrate 10 is about 2 to 5 nm, and the depression is set so as to remain even after oxidation of the gate.

Although no particular limitation is imposed on the impurities to be implanted into the silicon substrate 10, the silicon substrate 10 may be doped through oblique doping after oxidation of, e.g., the interior wall of the trench 20. Alternatively, a dopant may be initially diffused deeply into the semiconductor substrate 10 before deposition of a mask of nitride or oxide film.

As has been described above, the semiconductor device according to the first embodiment is provided with the trench material 21 (trench isolation region) for separating active regions formed on the primary surface of the semiconductor substrate 10. At least the surface of the trench material 21 which is to adjoin the semiconductor substrate 10 is depressed by a predetermined depth with respect to the primary surface of the semiconductor substrate 10.

Further, as shown in FIG. 4, a gate insulation film (oxide film) 30 is formed on the primary surface of the semiconductor substrate 10, and a gate electrode (conductive film) 40 is formed so as to form a continuous surface over the insulation film 30 and the trench material 21.

The first embodiment of the present invention as described above yields the advantages in increasing a drain current (Id) of a transistor, diminishing the body effect of the transistor, and reducing stress and boundary surface level.

Second Embodiment

Figure 7:
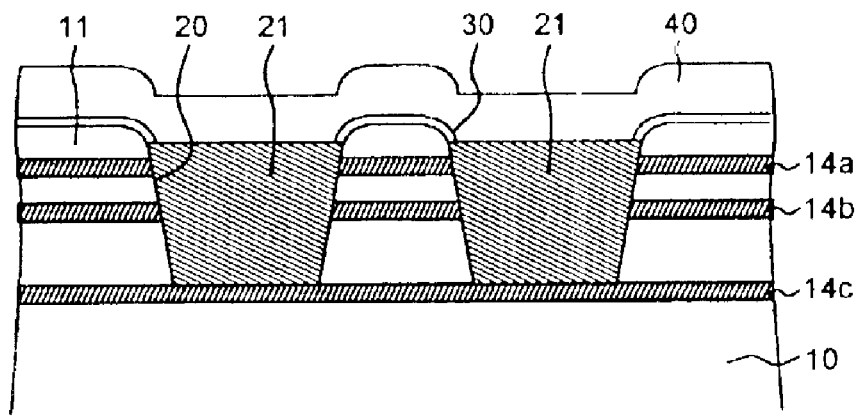
FIG. 7 is a partial cross-sectional view for describing a MOSFET in a semiconductor device according to a second embodiment of the present invention.

FIG. 7 is a cross-sectional view for describing a semiconductor device according to a second embodiment of the present invention. As in the case of FIG. 4, FIG. 7 corresponds to a cross-sectional view taken along line IV—IV of the plan view provided in FIG. 3. The second embodiment is directed to an improvement in the semiconductor device according to the first embodiment.

In FIG. 7, reference numerals 14a, 14b, and 14c designate specific impurity layers formed at different depths within the semiconductor substrate 10.

The second embodiment is characterized in that the silicon substrate 10 assumes a non-uniform impurity concentration where the trench 20 is formed. After formation of the trench 20, the impurity layers 14a, 14b, and 14c (ion-implanted layers) are formed by means of ion implantation. As a result, punch-through of a carrier current into an adjoining MOSFET can be prevented. The number of the ion-implanted layers is not particularly limited, so long at least two ion-implanted layers are provided.

Further, an epitaxially-grown substrate may be used as the semiconductor substrate 10.

As has been described above, the semiconductor device according to the second embodiment comprises a plurality of impurity layers 14a, 14b, and 14c formed at different depths within the semiconductor substrate 10 by means of ion implantation.

The second embodiment of the present invention as described above yields the advantages in increasing a drain current (Id) of a transistor, diminishing the body effect of the transistor, preventing punch-through of a carrier current in the transistor, and reducing a stress and boundary surface level.

Third Embodiment

Figure 8:
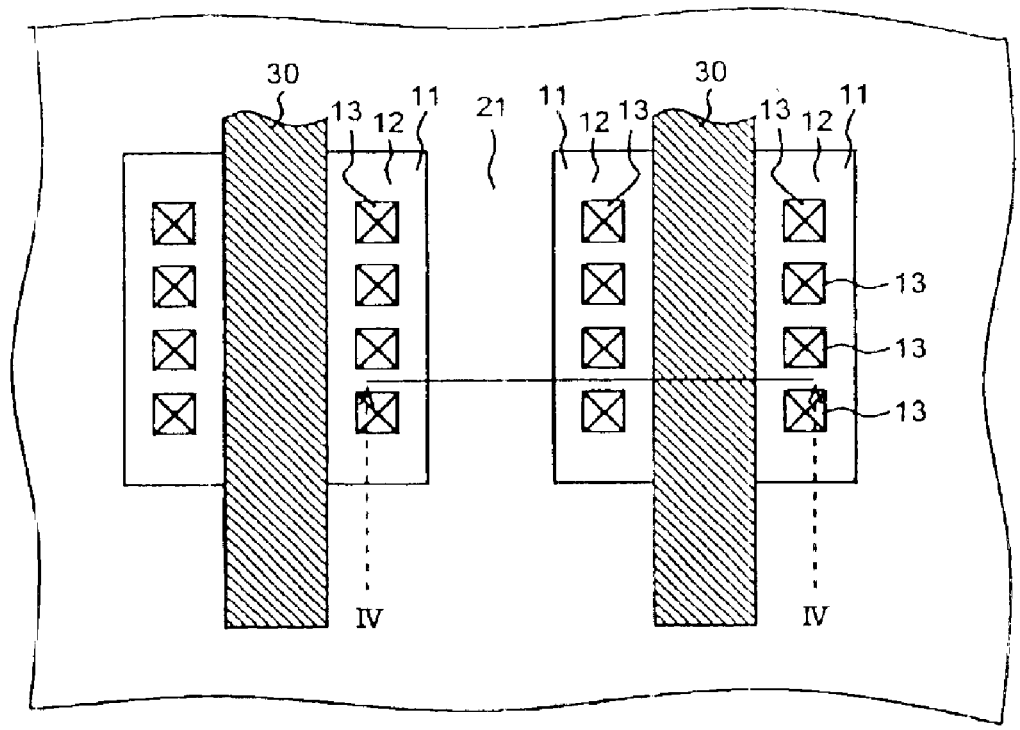
FIG. 8 is a partial plan view showing a semiconductor device in which a MOSFET is fabricated according to a third embodiment of the present invention.
Figure 9:
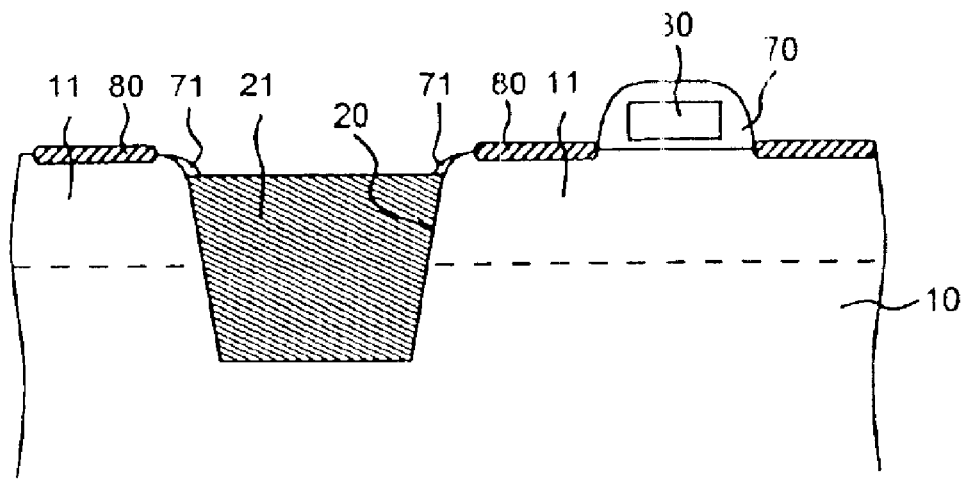
FIG. 9 is a partial cross-sectional view taken along the line IX—IX provided in FIG. 8.

FIGS. 8 and 9 are illustrations for describing a semiconductor device according to a third embodiment of the present invention. FIG. 8 is a plan view showing the semiconductor device in which a MOSFET is fabricated, and FIG. 9 is a cross-sectional view taken along line IX—IX provided in FIG. 8. FIG. 8 is a plan view taken before formation of a sidewall and a silicide layer, which will be described later.

In FIGS. 8 and 9, reference numeral 10 designates a semiconductor substrate, 11 designates a semiconductor substrate, 11 designates an active region, 12 designates a source of drain region; 13 designates a source or drain contact; 30 designates a gate electrode, 70 designates a sidewall, such as a silicon oxide film, formed on the side surface of the gate electrode 30; 71 designates an insulating film, such as a silicon oxide film, as a sidewall formed on the side surface of the semiconductor substrate 10, and is formed simultaneous with formation of the sidewall 70; and 80 designates a suicide layer.

The present embodiment corresponds to a semiconductor device according to the first embodiment in which a silicide layer is applied.

The silicide layer 80 is formed by means of sputtering with a metal typified by Ti, Co, Ni, or W, and by heating the silicon substrate 10 with a lamp to induce reaction in the silicon substrate 10.

The third embodiment is characterized in preventing deterioration in the withstand voltage at a junction at the trench edge, which would arise in a conventional semiconductor device.

The characteristics of the third embodiment will now be described by reference to FIG. 10 for describing the operation of the semiconductor device according to the third embodiment.

Figure 10:
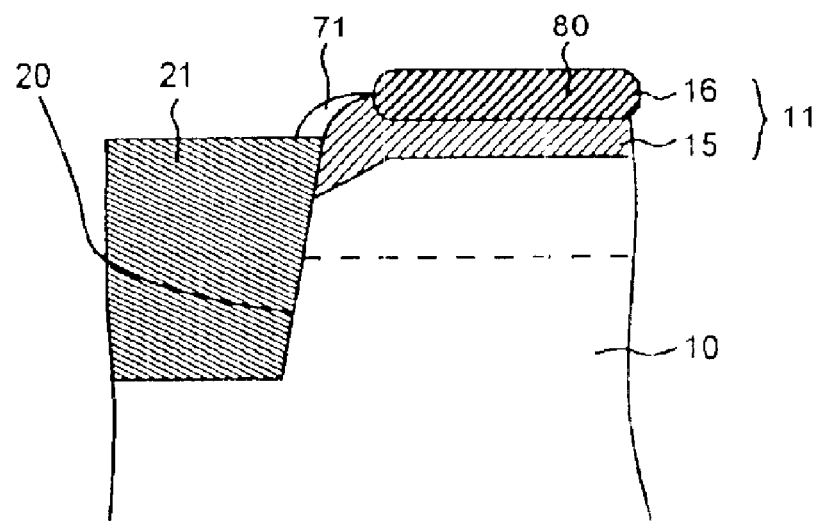
FIG. 10 is a partial cross-sectional view showing a semiconductor device as viewed from the widthwise direction of the gate for explaining the operation of the semiconductor device in the third embodiment.

In FIG. 10, reference numeral 10 designates a semiconductor su/bstrate; 11 designates an active region; 15 designates a p-type substrate region of the active region 11; 16 designates an n-type conductive layer of the active region 11; 20 designates a trench; 21 designates a trench material to be embedded into the trench 20; 71 designates an insulating film; and 80 designates a silicide layer.

In the present embodiment, the trench material 21 is depressed within the trench 20, and hence the n-type conductive layer 16, which is a reverse conductive layer, is formed to a depth considerably below the top of the trench 20. Further, the insulating film 71 is present along the trench edge, and the silicide layer 80 is formed at a position distant from the junction edge, thereby contributing to a rise in withstand voltage of the device.

As has been described above, the semiconductor device according to the third embodiment comprises the silicide layer 80 formed at a predetermined area on the primary surface of the semiconductor substrate 10 close to the trench material 21, and the insulating film 71 is formed within the depression of the trench material 21 so as to extend to the silicide layer 80 on the surface of the semiconductor substrate 10.

The third embodiment of the present invention as described above yields the advantages in improving a withstand voltage at a junction, and reducing stress and boundary surface level.

The structures shown in FIGS. 3 and 8 depict different portions in an identical semiconductor devices; in other words, the structures shown in FIGS. 3 and 8 may be formed in a different portions in one semiconductor device.

Fourth Embodiment

Figure 11:
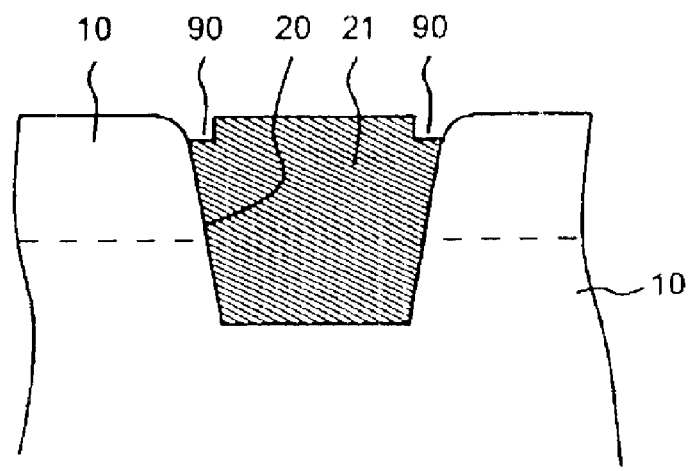
FIG. 11 is a partial cross-sectional view of a semiconductor device according to a fourth embodiment of the present invention.

FIG. 11 is a cross-sectional view for describing a semiconductor device according to a fourth embodiment of the present invention, and shows a cross-section of a trench isolation structure.

In FIG. 11, reference numeral 90 designates a depression formed along the outer periphery of the trench isolation structure.

In the present embodiment, the major surface of the trench material 21 is essentially flush with the surface of the primary surface of the semiconductor substrate 10. Along the edge of the upper surface of the trench material 21, the depression 90 is formed so as to become lower than the primary surface of the semiconductor substrate 10.

Figure 12:
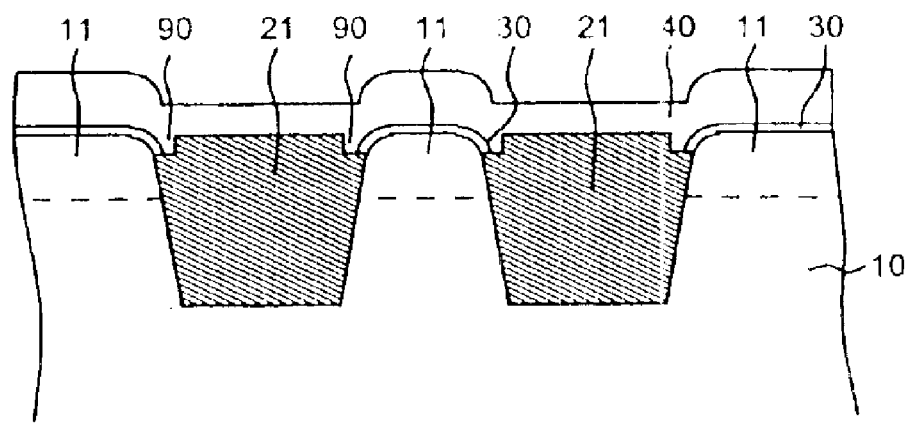
FIG. 12 is a partial cross-sectional view showing a structure of a MOSFET according to the fourth embodiment.

FIG. 12 is a cross-sectional view showing a structure of a MOSFET according to the present embodiment.

As compared with the semiconductor device according to the first embodiment shown in FIGS. 1 and 4, the semiconductor device shown in FIG. 12 yields the advantage of reducing the capacitance of the gate. Since the major surface of the trench material 21 (i.e., the entirety of the trench material 21 with the exception of the outer periphery thereof) is not recessed, the parasitic capacitance between the silicon substrate 10 and a transfer gate is reduced, thereby increasing the overall functioning speed of the semiconductor device.

FIGS. 13A to 13D are cross-sectional views for describing one example of a method of manufacturing the semiconductor device according to the fourth embodiment.

Figure 13A:
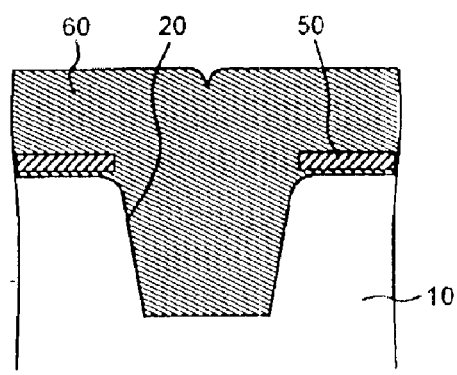
FIGS. 13A to 13D are partial cross-sectional views for describing an example of a method of manufacturing a semiconductor device according to the fourth embodiment.
Figure 13B:
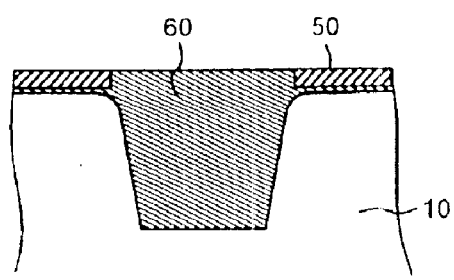
Figure 13C:
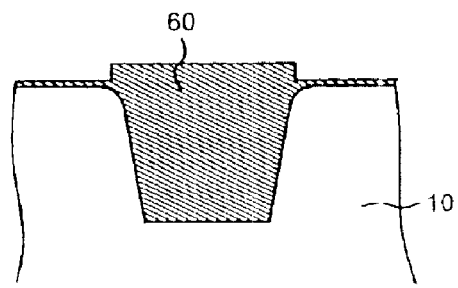
Figure 13D:
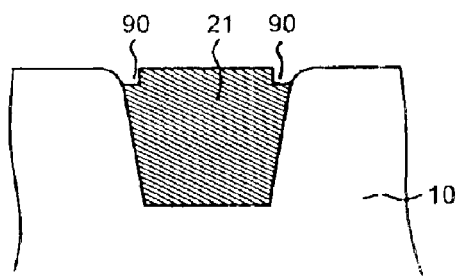

In FIG. 13A, similarly with FIG. 6A, the surface of the substrate 10 is covered with a nitride film 50. A trench material 60 (i.e. an silicon oxide layer as an insulating layer) is embedded in the trench 20, which is formed through etching on the surface of the semiconductor substrate 10. Similarly with FIG. 6B, FIG. 13B shows the trench material 60 after having been made smooth through dry etching or CMP. As shown in FIG. 13C, the nitride film 50 is removed through use of hot phosphoric acid. As shown in FIG. 13D, the trench material 60 is dissolved through use of hydrofluoric acid, thereby readily forming the recess 90 along the edge of the opening of the trench 20.

As has been described above, in the semiconductor device according to the fourth embodiment, the trench material 21 (isolation region) is formed such that the major surface thereof becomes substantially flush with the primary surface of the semiconductor substrate 10. Also, the trench material 21 is formed so as to become depressed along only the edge adjoining the semiconductor substrate 10.

The fourth embodiment of the present invention as described above yields the advantages in increasing a drain current of the transistor, diminishing the body effect of the transistor, preventing a parasitic capacitance between the transfer gate and the substrate, and preventing stress and kinetics at the boundary region.

Fifth Embodiment

Figure 14:
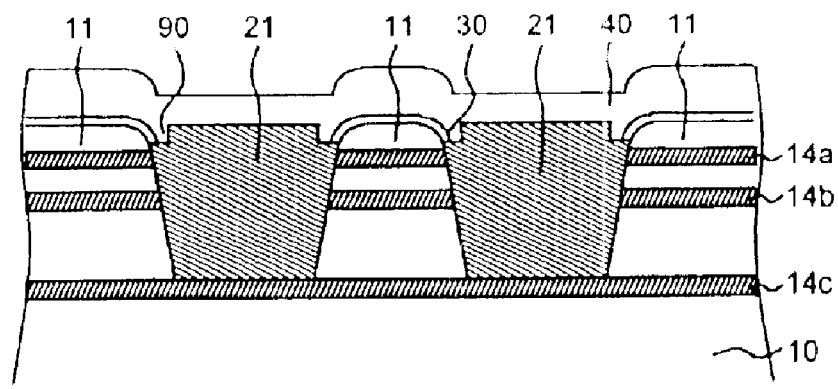
FIG. 14 is a partial cross-sectional view of a MOSFET in a semiconductor device according to a fifth embodiment of the present invention.

FIG. 14 is a cross-sectional view for describing a semiconductor device according to a fifth embodiment of the present invention.

In FIG. 14, reference numerals 14a, 14b, and 14c designate specific impurity layers within the semiconductor substrate 10.

The fifth embodiment corresponds to the fourth embodiment, in which the silicon substrate 10 assumes a non-uniform concentration of impurities where the trench 20 is formed. After formation of the trench 20, the impurity layers 14a, 14b, and 14c (ion-implanted layers) are formed by means of ion-implantation. As a result, punch-through of a carrier current to an adjoining MOSFET can be prevented. Further, in addition to the advantageous results yielded in the fourth embodiment, the fifth embodiment yields the advantage of diminishing parasitic capacitance.

An epitaxially-grown substrate may be used as the semiconductor substrate 10. In addition, no particular limitation is imposed on the number of ion-implanted layers, so long as at least two ion-implanted layers are provided.

The fourth embodiment of the present invention as described above yields the advantages in increasing the drain current of the transistor, diminishing the body effect of the transistor, preventing punch-through of a carrier current in the transistor, diminishing parasitic capacitance between the transfer gate and the semiconductor substrate, and reducing stress and kinetics at the boundary surface.

Sixth Embodiment

Figure 15:
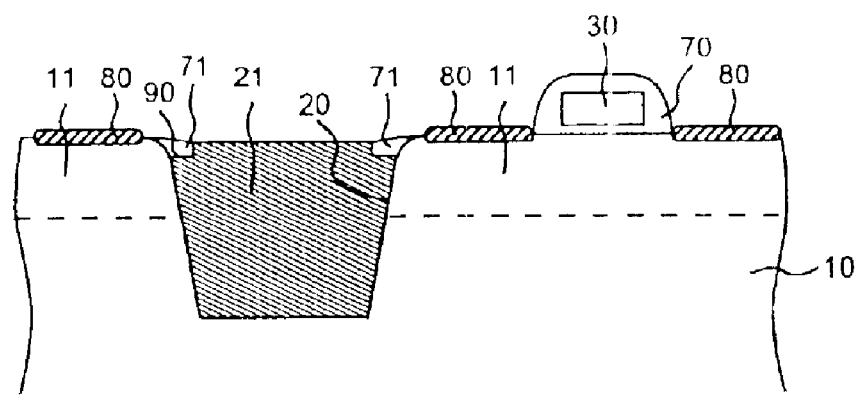
FIG. 15 is a partial cross-sectional view of a MOSFET in a semiconductor device according to a sixth embodiment of the present invention.

FIG. 15 is a cross-sectional view for describing a semiconductor device according to a sixth embodiment of the present invention, and shows a cross-section of a trench isolation structure.

In FIG. 15, reference numeral 90 designates a depression (recess) formed along the outer edge of the trench 20. Reference numeral 71 designates an insulating film, such as a silicon oxide film, filling the depression 90, and 80 designates a silicide layer.

The sixth embodiment corresponds to the fourth embodiment to which a silicide layer is applied.

Figure 16:
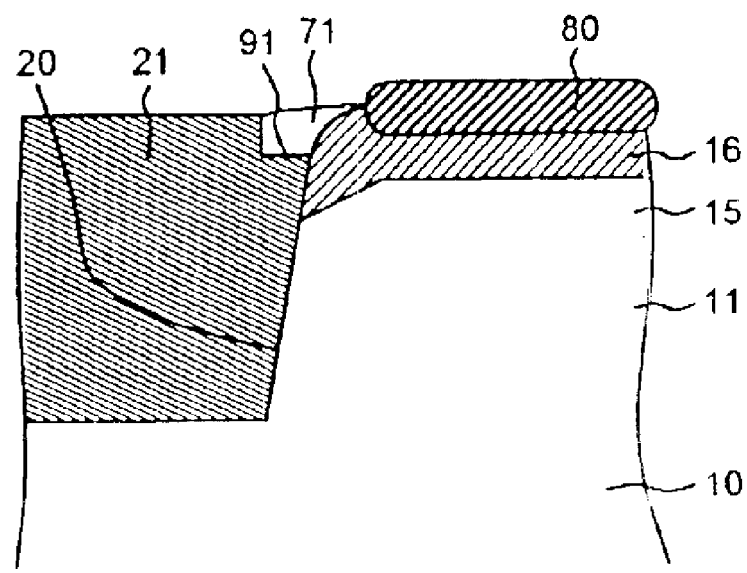
FIG. 16 is an enlarged partial cross sectional view for explaining the operation of the semiconductor device according to the sixth embodiment.

FIG. 16 is an enlarged fragmentary view to explain the operation of the semiconductor device according to the sixth embodiment.

In FIG. 16, reference numeral 10 designates a semiconductor substrate; 11 designates an active region; 15 designates a p-type substrate region of the active region 11; 16 designates an n-type conductive layer of the active region 11; 20 designates a trench; 21 designates a trench material embedded in the trench 20; 91 designates a depression formed along the edge of the trench material 21; 71 designates an insulating film, such as a silicon oxide film, filling the depression 91; and 80 designates a silicide layer.

As shown in FIG. 16, in the sixth embodiment, the depression 91 is formed along the edge of the trench material 21, and the depression 91 is filled with an insulating film 71. The n-type conductive layer 16, which is a reverse conductive layer, extends deeply at the edge of the trench 20, and the surface is covered by the insulating film 71. Accordingly, the silicide layer 80 is separated from the edge of the junction. Thus, a depletion layer can be extended, thereby eventually increasing the withstand voltage of the device.

The insulating film (oxide film) 71 can be formed simultaneously with formation of the gate sidewall (oxide film) 70 shown in FIG. 15.

As has been described above, in the semiconductor device according to the sixth embodiment, the depression 90 is formed in the trench material 21 along the edge of the primary surface of the semiconductor substrate 10, and the insulating film 71 is filled in the depression 90 so as to continuously extend to the silicide layer 80.

The sixth embodiment of the present invention as described above yields the advantages in increasing the withstand voltage of the device along the junction, diminishing parasitic capacitance between the transfer gate and the semiconductor substrate, and reducing stress and kinetics at the boundary surface.

Seventh Embodiment

Figure 17:
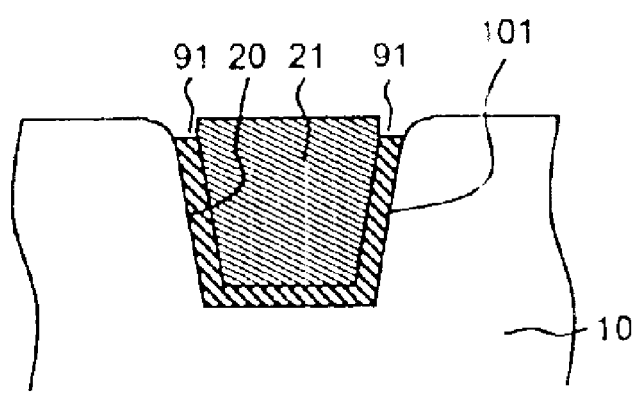
FIG. 17 is a partial cross-sectional view of a trench structure in a semiconductor device according to a seventh embodiment of the present invention.

FIG. 17 is a cross-sectional view for describing a semiconductor device according to a seventh embodiment of the present invention, and shows the cross-section of a trench isolation structure.

In FIG. 17, reference numeral 20 designates a trench; 21 designates a trench material (oxide layer) embedded in the trench 20; 101 designates a nitride film; and 91 designates a depression (recess) formed along the trench edge.

FIGS. 18A to 18D are cross-sectional views for describing one example of a method of manufacturing the semiconductor device according to the seventh embodiment of the present invention.

Figure 18A:
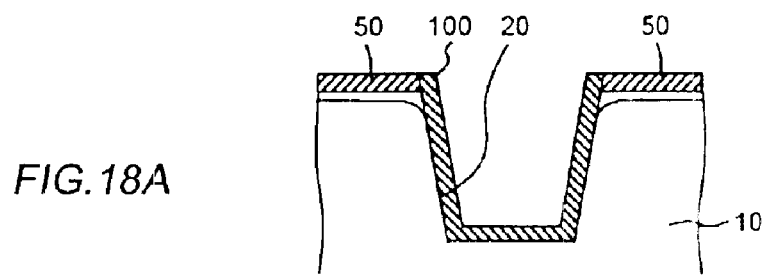
FIGS. 18A to 18D are partial cross-sectional views for describing an example of a method of manufacturing a semiconductor device according to the seventh embodiment of the present invention.
Figure 18B:
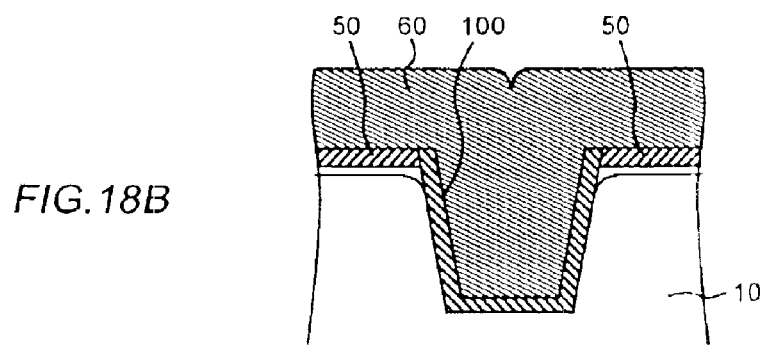

In FIG. 18A, the trench 20 is formed in the semiconductor substrate 10 while a nitride film 50 is used as a mask. A silicon nitride film 100 (an insulating film) is deposited directly on the interior wall surface of the trench 20. Further, as shown in FIG. 18B, the trench material 60 (i.e. an silicon oxide layer as an insulating layer) is deposited on the nitride film 100.

Figure 18C:
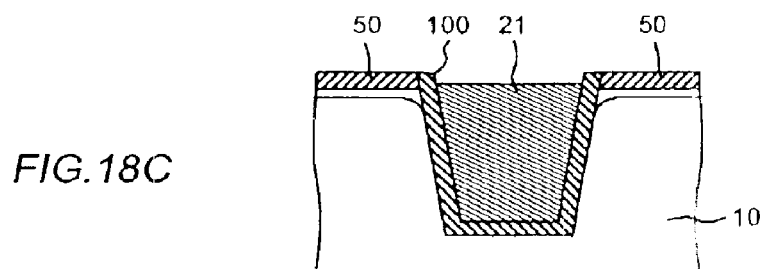
Figure 18D:
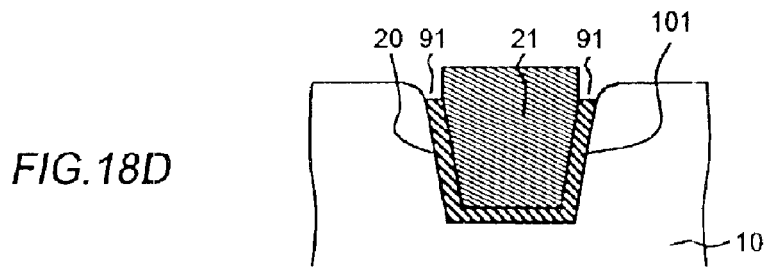

By means of dry etch back or CMP, the trench material (oxide film) 60 is etched back so as to yield a geometry as shown in FIG. 18C. Then, the nitride film 50 is removed through hot phosphoric acid in the step shown in FIG. 18D, thereby removing the upper portion of the nitride film 100 by a predetermined amount. At this time, the nitride film 100 embedded along the interior wall surface of the trench 20 is caused to recede, thus constituting the depression 91 and completing formation of a nitride film 101 as shown in FIG. 18D.

The seventh embodiment is characterized by the embedding of two types of materials in the trench 20. As a result, the depression (recess) 91 is formed along the edge of the trench 20 by virtue of a difference in etch rate between the trench material (oxide layer) 21 and the nitride film 100.

As has been described above, in the semiconductor device according to the seventh embodiment, the trench isolation region is formed from the nitride film (first insulating film) 101, which adjoins the semiconductor substrate 10 and is caused to recede from the primary surface of the semiconductor substrate 10 by a predetermined depth, and the trench material 21 embedded on the nitride film 101.

The seventh embodiment of the present invention as described above yields the advantages in increasing the drain current of the transistor, diminishing the body effect of the transistor, preventing punch-through of a carrier current in the transistor, and diminishing parasitic capacitance between the transfer gate and the semiconductor substrate.

For reference, a method of manufacturing a semiconductor device according to the present embodiment may be summarized as follows. In the method, a trench for a trench isolation structure is formed on a primary surface of a semiconductor substrate through a mask pattern formed on the primary surface of the semiconductor substrate. Next, an insulating film is formed along the interior wall surface of the trench. Then, an insulating layer is formed on the primary surface of the semiconductor substrate so as to fill the trench along the surface of the insulating film. Then, the insulating layer is removed substantially to the height of the primary surface of the semiconductor substrate. Then, the mask pattern is removed. Further, the insulating film is removed by a predetermined amount, to thereby cause the insulating film to recede from the primary surface of the semiconductor substrate by a predetermined depth thereby forming a trench isolation structure.

Eighth Embodiment

Figure 19:
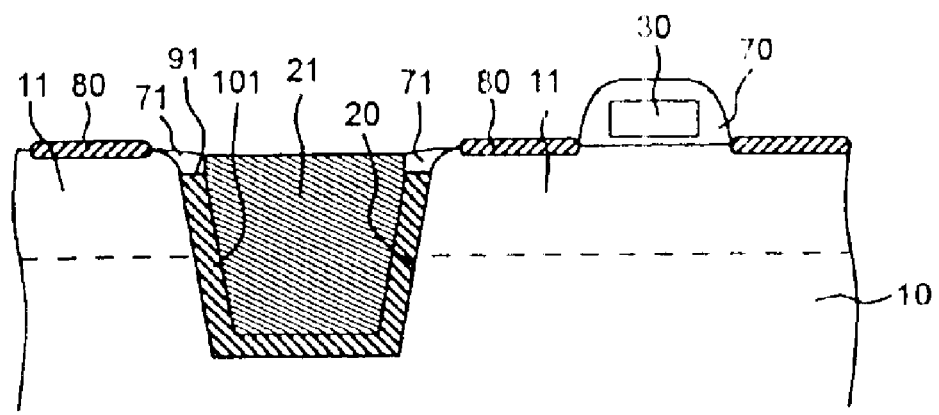
FIG. 19 is a partial cross-sectional view of a MOSFET in a semiconductor device according to an eighth embodiment of the present invention.

FIG. 19 is a cross-sectional view for describing a semiconductor device according to an eighth embodiment of the present invention, and shows the structure of a MOSFET.

The eighth embodiment corresponds to the seventh embodiment to which the silicide layer described in connection with the third embodiment is applied.

In FIG. 19, reference numeral 101 designates a nitride film formed along the interior wall surface of the trench 20; 21 designates a trench material embedded in the trench 20 (trench oxide layer); 91 designates a depression formed as a result of recession of the nitride film 101; 71 designates an insulating film (oxide film) filling the depression 91; and 80 designates a silicide layer.

The silicide layer 80 is formed into a structure as shown by means of sputtering the silicon substrate 10 with metal typified by Ti, Co, Ni, or W, and by heating the silicon substrate 10 with a lamp to cause reaction.

By means of such a structure, the present embodiment yields advantages including those yielded by the silicide layer used in the third embodiment and those yielded as a result of depression of the edge of the trench according to the seventh embodiment, thereby increasing the withstand voltage of the device to a much greater extent.

The combination of materials is not limited to the combination including an oxide film and a nitride film, and another combination of materials may be employed, so long as the materials differ in etch rate.

The eighth embodiment of the present invention as described above yields the advantages in increasing the withstand voltage of the device at the junction and diminishing parasitic capacitance between the transfer gate and the semiconductor substrate.

Ninth Embodiment

Figure 20:
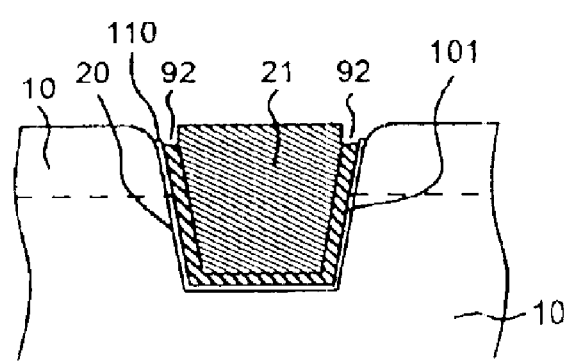
FIG. 20 shows a partial cross-sectional view of a trench isolation structure in a semiconductor device according to a ninth embodiment of the present invention.

FIG. 20 is a cross-sectional view for describing a semiconductor device according to a ninth embodiment of the present invention, and shows the cross-section of a trench isolation structure.

In FIG. 20, reference numeral 20 designates a trench; 110 designates a thin insulating film (oxide film) formed along the interior surface of the trench 20; 101 designates a nitride film formed along the interior wall surface of the insulating film (oxide film) 110; and 21 designates a trench material embedded on the nitride film 101. Further, reference numeral 92 designates a depression formed as a result of recession of the nitride film 101.

In the present embodiment, three layers of material are embedded in the trench 20. In a case where two layers of material are embedded into the trench 20 as in the eighth embodiment, the nitride film 101 directly adheres to the edge of the trench, thereby resulting in a chance of stress or kinetics arising in the boundary surface. So long as the three layers of material are embedded, as in the case of the present embodiment, such a problem may be prevented.

FIGS. 21A to 21D are cross-sectional views for describing one example of a method of manufacturing the semiconductor device according to a ninth embodiment.

Figure 21A:
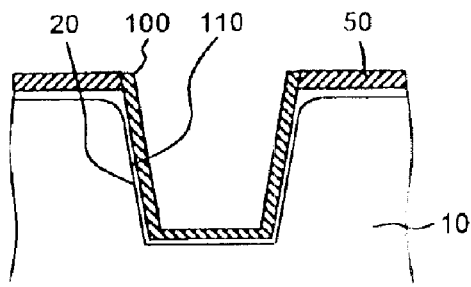
FIGS. 21A to 21D are partial cross-sectional views for describing an example of a method of manufacturing a semiconductor device according to a ninth embodiment.
Figure 21B:
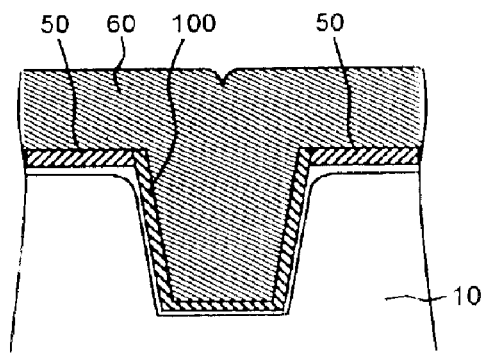
Figure 21C:
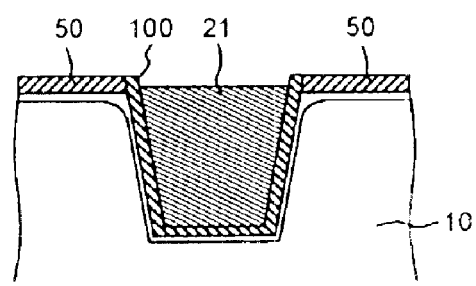
Figure 21D:
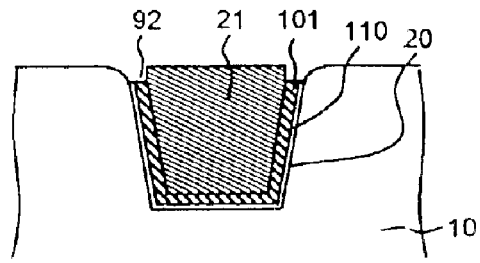

As shown in FIG. 21A, a trench 20 is formed in the semiconductor substrate 10 by means of etching while the nitride film 50 is used as a mask, and the interior wall surface of the trench 20 is oxidized. Further, the nitride film 100 is deposited on the surface of the trench 20. As shown in FIG. 21B, the trench material 60 (i.e. an silicon oxide layer as an insulating layer) is deposited on the surface of the semiconductor substrate 10, and the semiconductor substrate 10 is etched back, as shown in FIG. 21C. Finally, as shown in FIG. 21D, the nitride film 50 shown in FIG. 21C is removed with hot phosphoric acid, and the top portion of the nitride film 100 is removed by a predetermined amount, thus forming the depression 92. Consequently, a nitride film 101 remains and assumes a final geometry shown in FIG. 20.

As has been described above, in the semiconductor device according to the ninth embodiment, the trench isolation region is formed from a thin first insulating film 110, such as a silicon oxide film, adjoining the semiconductor substrate 10; a second insulating film 101, such as a silicon nitride film, which is formed on the interior surface of the first insulating film 110 and is depressed with reference to the primary surface of the semiconductor substrate 10 by a predetermined depth; and the trench material 21 (an insulating layer) embedded in the trench 20 along the interior surface of the nitride film 101.

The ninth embodiment of the present invention as described above yields the advantages in increasing the drain current of the transistor, diminishing the body effect of the transistor, diminishing parasitic capacitance between the transfer gate and the semiconductor substrate, and reducing stress and kinetics at the boundary surface.

For reference, a method of manufacturing a semiconductor device according to the present embodiment may be summarized as follows. In the method, a trench for a trench isolation structure is formed on a primary surface of a semiconductor substrate through a mask pattern formed on the primary surface of the semiconductor substrate. A first insulating film is formed along the interior wall surface of the trench. Then, a second insulating film is formed along the interior wall surface of the first insulating film in the trench. Next, an insulating layer is formed on the primary surface of the semiconductor substrate so as to fill the trench along the interior wall surface of the second insulating film. Thereafter, the insulating layer is removed substantially to the height of primary surface of the semiconductor substrate, and the mask pattern is removed. Further, the second insulating film is removed by a predetermined amount, to thereby causes the second insulating film to recede from the primary surface of the semiconductor substrate by a predetermined depth thereby forming a trench isolation structure.

Tenth Embodiment

Figure 22:
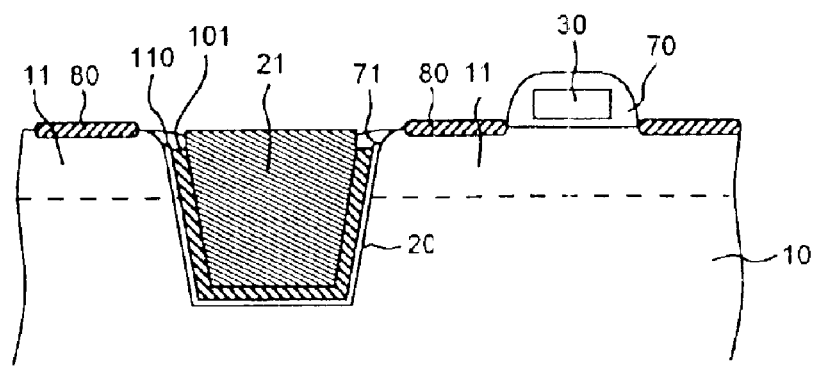
FIG. 22 is a partial cross-sectional view of a structure of a MOSFET in a semiconductor device according to a tenth embodiment of the present invention.
Figure 23:
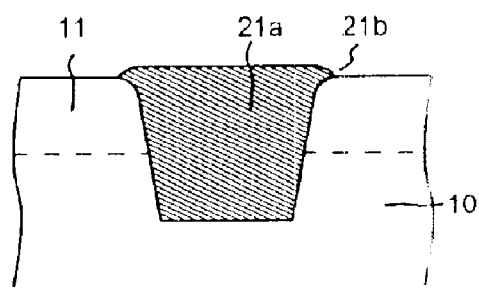
FIG. 23 is a partial cross-sectional view of a trench isolation structure in a conventional semiconductor device as viewed from the widthwise direction of the gate.

FIG. 22 is a cross-sectional view for describing a semiconductor device according to a tenth embodiment of the present invention, and shows the structure of a MOSFET.

In FIG. 22, reference numeral 20 designates a trench; 110 designates a thin insulating film (oxide film) covering the interior surface of the trench 20; 101 designates a nitride film covering the interior surface of the insulating film 110; 21 designates a trench material embedded in the trench 20; 92 designates a depression (recess) formed along the edge of the trench 20; 71 designates an insulating film (oxide film) filling the depression 92; and 80 designates a silicide layer.

The present embodiment corresponds to the ninth embodiment to which a silicide layer 80 is applied. By employment of such a composite structure, the withstand voltage of the device is improved to a much greater extent.

As has been described above in the various embodiments, the present invention provides a semiconductor device which has an improved trench isolation structure and is improved so as to increase the drain current of a transistor or increase the withstand voltage of a gate at a junction, as well as a method of manufacturing such semiconductor device.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-203849, filed on Jul. 16, 1999 including specification, claims, drawings and summary, on which the Convention priority of the present application is based, are incorporated herein by reference in its entirety.

What is claimed is:

1. A method of manufacturing a semiconductor device, comprising the steps of:

forming a trench for a trench isolation structure on a primary surface of a semiconductor substrate through a mask pattern formed on the primary surface of said semiconductor substrate;

forming an insulating layer on the surface of said mask pattern formed on the primary surface of said semiconductor substrate so as to fill said trench;

removing said insulating layer substantially to the height of the primary surface of said mask pattern;

removing said mask pattern; and removing said insulating layer at least at a portion adjoining said semiconductor substrate to recede from the primary surface of said semiconductor substrate by a predetermined depth thereby forming a trench isolation structure so that an obtuse angle is formed between the primary surface of said semiconductor substrate and a side surface of the semiconductor substrate adjoining said trench isolation structure, and a curved surface is formed so as to extend from the primary surface to the side surface of said semiconductor substrate.

* * * * *